United States Patent
Pourghaderi et al.

(10) Patent No.: US 9,741,848 B2
(45) Date of Patent: Aug. 22, 2017

(54) MULTI-GATE TUNNEL FIELD-EFFECT TRANSISTOR (TFET)

(71) Applicant: IMEC VZW, Leuven (BE)

(72) Inventors: Mohammad Ali Pourghaderi, Heverlee (BE); AliReza Alian, Heverlee (BE)

(73) Assignee: IMEC VZW, Leuven (BE)

(*) Notice: Subject to any disclaimer, the term of this patent is extended or adjusted under 35 U.S.C. 154(b) by 0 days.

(21) Appl. No.: 15/337,776

(22) Filed: Oct. 28, 2016

(65) Prior Publication Data
US 2017/0179283 A1    Jun. 22, 2017

(30) Foreign Application Priority Data

Dec. 22, 2015    (EP) .................................... 15201916

(51) Int. Cl.
*H01L 29/02*    (2006.01)
*H01L 29/78*    (2006.01)
(Continued)

(52) U.S. Cl.
CPC ...... *H01L 29/7831* (2013.01); *H01L 29/0847* (2013.01); *H01L 29/1033* (2013.01); *H01L 29/42376* (2013.01)

(58) Field of Classification Search
CPC ............. H01L 29/513; H01L 29/66825; H01L 29/42324; H01L 29/78696; H01L 29/775
See application file for complete search history.

(56) References Cited

U.S. PATENT DOCUMENTS 9,461,044 B1 * 10/2016 Chang ................. H01L 27/0886
2009/0101975 A1 * 4/2009 Holz .................. H01L 21/82341
257/347
(Continued)

FOREIGN PATENT DOCUMENTS

WO    WO 2008/072164    6/2008

OTHER PUBLICATIONS

Saurabh, et al., "Novel Attributes of a Dual Material Gate Nanoscale Tunnel Field-Effect Transistor", IEEE Transactions on Electron Devices, vol. 58, No. 2, Feb. 1, 2011, pp. 404-410, XP011343598.
(Continued)

*Primary Examiner* — Roy Potter
(74) *Attorney, Agent, or Firm* — Knobbe Martens Olson & Bear, LLP

(57) ABSTRACT

A Tunnel Field-Effect Transistor (TFET) is provided comprising a source-channel-drain structure of a semiconducting material. The source-channel-drain structure comprises a source region being n-type or p-type doped, a drain region oppositely doped than the source region and an intrinsic or lowly doped channel region situated between the source region and the drain region. The TFET further comprises a reference gate structure covering the channel region and a source-side gate structure aside of the reference gate structure wherein the work function and/or electrostatic potential of the source-side gate structure and the reference work function and/or electrostatic potential of the reference gate structure are selected for allowing the tunneling mechanism of the TFET device in operation to occur at the interface or interface region between the source-side gate structure and the reference gate structure in the channel region.

16 Claims, 5 Drawing Sheets

(51) Int. Cl.
*H01L 29/08* (2006.01)
*H01L 29/10* (2006.01)
*H01L 29/423* (2006.01)

(56) References Cited

U.S. PATENT DOCUMENTS

2012/0223387 A1  9/2012  Cui et al.
2014/0084388 A1  3/2014  Goto

OTHER PUBLICATIONS

Wang, et al., "A Novel Barrier Controlled Tunnel FET", IEEE Electron Device Letters, vol. 35, No. 7, Jul. 1, 2014, pp. 798-800, XP011552140.

* cited by examiner

MULTI-GATE TUNNEL FIELD-EFFECT TRANSISTOR (TFET)

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 15201916.2, filed on Dec. 22, 2015. The aforementioned application is incorporated by reference herein in its entirety, and is hereby expressly made a part of this specification.

FIELD OF THE DISCLOSURE

Tunnel field effect transistors (TFET) where the tunnelling effect is based on band-to-band tunnelling are provided, for use in the field of semiconductor devices and nanotechnology.

BACKGROUND OF THE DISCLOSURE

Nanoelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and because it becomes difficult to decrease the supply voltage. The latter is mainly due to the fact that the subthreshold swing is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold swing can theoretically be less than 60 mV/dec, the physical limit of conventional MOSFETs, however in practice this has not been achieved with current TFETs.

There is a further need for improvement of TFET design and TFET device performance.

SUMMARY OF THE DISCLOSURE

It is an object of particular embodiments to provide a tunnel Field Effect transistor (TFET) with improved performance thereby.

It is another object of embodiments to provide TFET with good device properties, in particular for example a TFET with good $I_{DS}$-$V_{GS}$-characteristics, meaning with a subthreshold swing less than 60 mV/dec.

The above objectives are accomplished by a device according to embodiments.

Particular and preferred aspects of the invention are set out in the accompanying independent and dependent claims. Features from the dependent claims may be combined with features of the independent claims and with features of other independent claims as appropriate and not merely as explicitly set out in the claims.

According to an aspect, a Tunnel Field-Effect Transistor (TFET) is provided, the Tunnel Field-Effect Transistor (TFET) comprising a source-channel-drain structure of a semiconducting material comprising a source region doped with a dopant element having a source type of doping being N or P, a drain region doped with a dopant element having drain type of doping being opposite to the source type of doping, a channel region situated between the source region and the drain region and forming a source-channel interface with the source region and a drain-channel interface with the drain region, the channel region being intrinsic or lowly doped; a reference gate structure comprising a reference gate dielectric layer and a reference gate electrode having a reference work function and a reference electrostatic potential, being the electrostatic potential present at the reference gate electrode, the reference gate dielectric layer sandwiched in between the semiconducting material of the channel region and the reference gate electrode; a source-side gate structure aside of the reference gate structure, the source-side gate structure comprising a source-side gate dielectric layer and a source-side gate electrode having a work function and/or an source-side electrostatic potential, being the electrostatic potential present at the source-side gate electrode, the source-side gate dielectric layer sandwiched between the semiconducting material of the channel region and the source-side gate electrode; and wherein the work function or the electrostatic potential of the source-side gate structure and the reference gate structure are selected for allowing the tunneling mechanism of the TFET device in operation to occur at the interface or interface region in the channel region between the source-side gate structure and the reference gate structure.

According to embodiments the TFET comprises a source-channel-drain structure of a semiconducting material, a reference gate structure and a source-side gate structure. The source-channel-drain structure comprises a source region doped with a dopant element having a source type of doping being N or P, a drain region doped with a dopant element having drain type of doping being opposite to the source type of doping and a channel region situated between the source region and the drain region and forming a source-channel interface with the source region and a drain-channel interface with the drain region, the channel region being intrinsic or lowly doped. The reference gate structure comprises a reference gate dielectric layer and a reference gate electrode having a reference work function, the reference gate dielectric layer being sandwiched in between the semiconducting material of the channel region and the reference gate electrode. The source-side gate structure is positioned aside of the reference gate structure and comprises a source-side gate dielectric layer and a source-side gate electrode having a work function, the source-side gate dielectric layer sandwiched between the semiconducting material of the channel region and the source-side gate electrode. The work function and reference work function are selected for allowing the tunneling mechanism of the TFET device in operation to occur at the interface or interface region in the channel region between the source-side gate structure and the reference gate structure.

According to embodiments the TFET comprises a source-channel-drain structure of a semiconducting material comprising a source region doped with a dopant element having a source type of doping being N or P, a drain region doped with a dopant element having drain type of doping being opposite to the source type of doping, a channel region situated between the source region and the drain region and forming a source-channel interface with the source region and a drain-channel interface with the drain region, the channel region being intrinsic or lowly doped; a reference gate structure comprising a reference gate dielectric layer and a reference gate electrode having an electrostatic potential at the reference gate electrode, the reference gate dielectric layer sandwiched in between the semiconducting material of the channel region and the reference gate electrode; a source-side gate structure aside of the reference gate structure, the source-side gate structure comprising a source-side gate dielectric layer and a source-side gate electrode having an electrostatic potential at the source-side gate electrode, the source-side gate dielectric layer sandwiched between the semiconducting material of the channel region and the source-side gate electrode; and wherein the difference in electrostatic potential between the source-side gate structure and reference gate structure is selected for allowing the tunneling mechanism of the TFET device in operation to occur at the interface or interface region in the channel region between the source-side gate structure and the reference gate structure.

According to embodiments the difference between the work function and the reference work function is at least the band gap of the semiconductor material.

According to embodiments the work function is larger than the reference work function for a P-type source region and the work function is smaller than the reference work function for an N-type source region.

According to embodiments the difference between the electrostatic potential and the reference electrostatic potential is at least the band gap of the semiconductor material.

According to embodiments the source-side gate structure and the reference gate structure are positioned at a distance of each other. The distance may be smaller than 10 nm.

According to embodiments the source-side gate structure has an overlap with the source region and the reference gate structure has an overlap or an underlap with the drain region. The overlap or underlap may be in a range of 0 to 10 nm.

According to embodiments the TFET may further comprise a pocket gate structure, the pocket gate structure comprising a pocket gate dielectric layer and a pocket gate electrode having a pocket work function, the pocket gate structure located on the channel region in between the source-side gate structure and the reference gate structure.

According to embodiments the pocket work function is selected to create a locally sharp band bending at the interface or interface region in the channel region in between the source-side gate structure and the pocket gate structure.

According to embodiments the pocket work function is smaller than the reference work function for a P-type source region and the pocket work function is larger than the reference work function for an N-type source region.

According to embodiments the doping level of the channel region is in the range of undoped up to $10^{18}/cm^3$. According to embodiments the doping level of the source region or the drain region is in the range of $10^{19}/cm^3$ to $4e10^{20}/cm^3$ and $10^{18}/cm^3$ to $4e10^{20}/cm^3$ respectively.

According to embodiments the source-channel-drain structure is a horizontal structure and the gate electrodes are single gate structures. According to alternative embodiments the source-channel-drain structure is a horizontal structure and the gate electrodes are double gate structures situated at both sidewalls of the horizontal source-channel-drain structure opposite to each other. According to alternative embodiments source-channel-drain structure is a horizontal structure or vertical structure and the gate electrodes are gate all around structures situated around the horizontal or vertical source-channel-drain structure.

According to embodiments the source-channel-drain structure comprises a nanostructure such as a nanowire or a nanosheet.

The TFET device according to an aspect and its embodiments solves the problem related to any kind of interfering phenomenon due to the high doping in the source region, such as Urbach tails or impurity bands, the latter additionally also resulting in bandgap narrowing.

It is an advantage of the TFET according to an aspect that it has a low subthreshold swing SS more particularly being lower than 60 mV/dec at room temperature.

It is an advantage of the TFET according to an aspect that the influence of dopant related non-idealities in the source region are reduced. More specifically band tails (or also often referred to as Urbach tails) in the source region of the TFET are reduced or even eliminated.

It is an advantage that the TFET structure according to certain embodiments may be applied for low power and low cost applications.

The high performance achieved for the TFET device according to certain embodiments is an advantage compared to prior-art TFET devices.

BRIEF DESCRIPTION OF THE DRAWINGS

The invention will now be described further, by way of example, with reference to the accompanying drawings. All figures are intended to illustrate some aspects and particular embodiments of the present invention. The figures are depicted in a simplified way for reason of clarity. Not all alternatives and options are shown and therefore the invention is not limited to the content of the given drawings. Like numerals are employed to reference like parts in the different figures.

All drawings are intended to illustrate some aspects and embodiments of the present disclosure. The drawings described are only schematic and are non-limiting.

DETAILED DESCRIPTION OF ILLUSTRATIVE EMBODIMENTS

Figure 1:
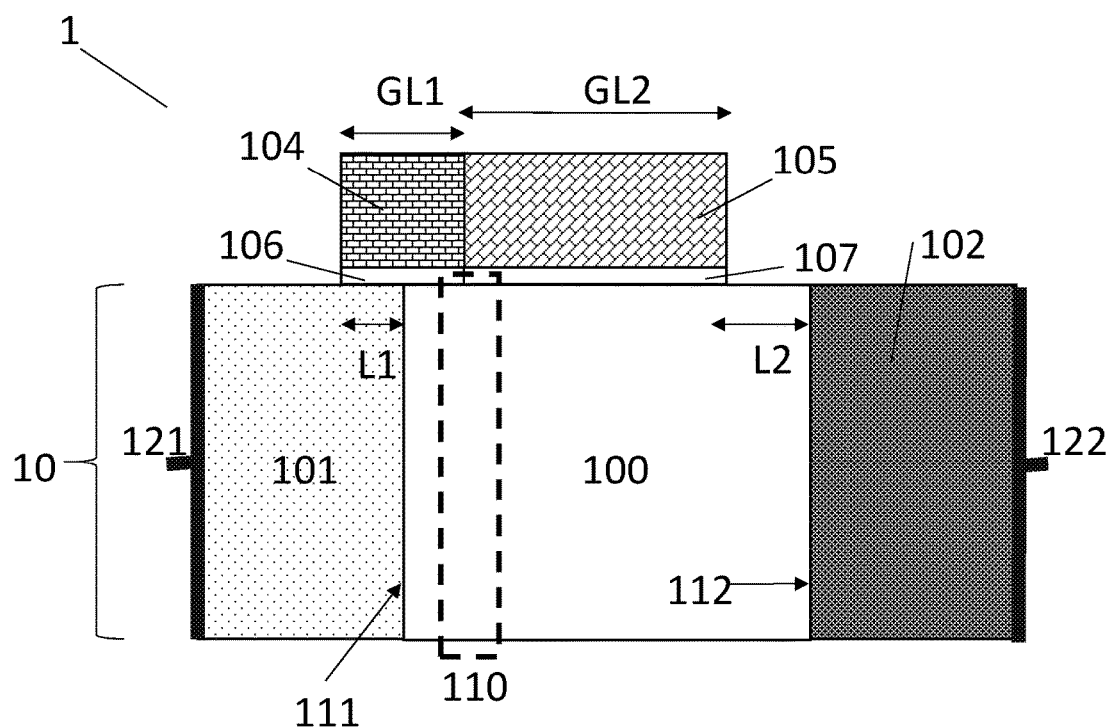
FIG. 1 illustrates schematic representations of a cross-section of a TFET structure according to an embodiment wherein the source-side gate structure and the reference gate structure are in physical contact with each other.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary particular embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

When using the term "tunnelling field effect transistor (TFET)" through the text, reference is made to a semiconductor device in which a gate controls a source-to-drain current through modulation of the so-called Band-To-Band Tunnelling (BTBT). Band-to-band tunnelling is a process in which electrons tunnel from the valence band through the semiconductor bandgap to the conduction band or vice versa.

While some embodiments described herein include examples of a n-type TFET (nTFET), which means the semiconductor device comprises a p-type source and a n-type drain (also often referred to as a p-i-n diode TFET or n-channel TFET), also other implementations of TFET devices may be applied such as for example a p-type TFET (pTFET or p-channel TFET), which means the semiconductor device comprises an n-type source (with a gate electrode at least partially surrounding the source regions, e.g. a gate electrode located on or around the source region) and a p-type drain.

Whenever there is referred to a gate structure, this gate structure comprises a gate dielectric and a gate electrode. The gate dielectric layer is a layer which is sandwiched in between the source-channel-drain structure and the gate electrode. The gate electrode may comprise a conductive material, for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), work function tunable metals, engineered materials to obtain a particular gate work function. In particular embodiments the gate electrode is made of a metal of which the work function has been engineered specifically for the chosen channel material in the channel region, the gate dielectric material, gate dielectric thickness and channel doping. The gate dielectric layer extends along at least part of the source-channel-drain structure and the gate electrode layer extends along the gate dielectric layer along a face of the gate dielectric layer opposing the face of the gate dielectric layer facing the source-channel-drain structure. The gate electrode layer does not extend beyond the gate dielectric layer. At least part of the gate electrode layer and the gate dielectric layer may extend along at least part of the channel layer. The gate dielectric is at least situated below the whole length of the gate electrode but can extend longer, such as covering up to the whole length of the TFET structure, i.e., of the underlying source-channel-drain structure.

The gate dielectric may be selected from at least one of silicon based oxides (e.g., silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments the gate dielectric is a high-k oxide (oxide having a dielectric constant (k-value) higher than the k-value of $SiO_2$) such as for example hafnium oxide. The thickness of the gate dielectric, e.g., gate oxide, is preferably in the range of 0.5 nm to 20 nm.

An ideal TFET relies upon a sharp band edge (between the source region and the channel region) such that abrupt switching is possible, i.e. when the valence band of the source region overlaps with the conduction band of the channel region. However the band edges are not perfectly sharp due to Urbach tails. Urbach tails are states in the forbidden bandgap, whereby the density of these states decreases exponentially with distance to the band edge. As a consequence a steep onset of TFET will be degraded and is thus less steep depending on the magnitude of the Urbach tails.

It is an object of certain aspects and embodiments to overcome this disadvantage of any kind of interfering phenomenon due to the high doping in the source region, such as for example Urbach tails and provide a TFET device which is less susceptible to the Urbach tails and therefore can get steeper sub-threshold swing (SS), i.e. sub-60 mV/dec.

FIG. 1 shows a schematic representation of a cross-section of a TFET device according to an aspect.

The TFET device 1 comprises a source-channel-drain structure 10 of a semiconducting material. According to embodiments of the present disclosure, the overall semiconducting material, i.e. the basic material from which the source-channel-drain structure 10, is formed may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof, carbon nanotubes or a two-dimensional material (also known as 2D-material or single-layer material such as for example graphene or transition metal dichalcogenides).

According to embodiments the source-channel-drain structure 10 may comprise a heterostructure. Preferably the resulting heterostructure consists of materials having a similar lattice constant, such that the resulting heterostructure interface has a high quality, meaning a low defect density. Examples of such material combinations are InP/In$_{0.53}$Ga$_{0.47}$As (lattice matched), InAs/GaSb (small lattice mismatch of 0.6%), In$_{0.53}$Ga$_{0.47}$As/GaAs$_{0.5}$Sb$_{0.5}$ (lattice matched). In case of a heterostructure, the heterostructure interface (i.e. the interface between the different materials) should preferably align with the interface region 110 between the reference gate structure 105, 107 and the source-side gate structure 104, 106. That is, the heterostructure interface should not coincide with the source-channel interface.

According to embodiments the source-channel-drain structure 10 may be a nanostructure, such as a nanowire or a nanosheet.

The source-channel-drain structure 10 comprises a source region 101 for providing carriers which will be used for band-to-band tunneling towards the drain region via the channel region, a drain region 102 and a channel region 100 which is situated between the source region 101 and the drain region 102. The source-channel-drain 10 structure may have a longitudinal direction.

The source region 101 is doped with a dopant element having a source type of doping being N or P and having a doping concentration. The source region 101 is thus n-type doped or p-type doped depending on the kind of TFET device (p-TFET has n-type source region and vice versa). The source region 101 may have a doping concentration of $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$. The source region 101 further comprises an electrical source contact 121.

The drain region 102 is oppositely doped with respect to the source region and has a doping concentration of $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$. The drain region 102 further comprises an electrical drain contact 122.

The electrical source and/or drain contact may comprise a conductive material which is selected from at least one of a silicide containing structure (NiSi, CoSi$_2$, TiSi$_2$, or the like), a germanide containing structure, a metal containing structure, poly silicon or a combination thereof. In particular embodiments the source and/or drain electrical contact may be a combination of a metal with a silicide. Also disclosed are contacts, formed of e.g., conductive oxides and even conductive polymers.

Depending on whether an n-TFET or p-TFET, different dopant types may be used for the source region 101 and/or drain region 102. For a Si-based TFET, possible p-type dopants are B, Al, Ga, In, Tl, Pd, Na, Be, Zn, Au, Co, V, Ni, MO, Hg, Sr, Ge, Cu, K, Sn, W, Pb, O, Fe; and possible n-type dopants are Li, Sb, P, As, Bi, Te, Ti, C, Mg, Se, Cr, Ta, Cs, Ba, S, Mn, Ag, Cd, Pt. For a Ge-based TFET, possible p-type dopants are B, Al, Tl, Ga, In, Be, Zn, Cr, Cd, Hg, Co, Ni, Mn, Fe, Pt; and possible n-type dopants are Li, Sb, P, As, S, Se, Te, Cu, Au, Ag.

The channel region 100 is situated in between the source region and the drain region. The channel region is intrinsically or lowly doped. This means the channel region is a high resistant region which is lowly p-type or n-type doped so that most of the potential drops across the channel region. The channel region 100 has a doping level below $10^{18}$ cm$^{-3}$, preferably between $10^{15}$ cm$^{-3}$ and $10^{17}$ cm$^{-3}$. The channel region may also comprise an undoped channel semiconductor material. Alternatively, the source-side of the channel may be more highly doped than the drain-side of the channel, with the source-side channel doping being lower than the doping in the source region.

The TFET device 1 further comprises a source-channel interface 111 between the source 101 and the channel region 100 and a drain-channel interface 112 between the channel region 100 and the drain region 102.

The TFET device 1 further comprises a reference gate structure 105, 107 and a source-side gate structure 104, 106.

The reference gate structure thus comprises a reference gate dielectric layer 105 and a reference gate electrode 107. The reference gate electrode is determined by its work function, the reference work function (WFref). The reference gate structure has a gate length (GL2).

The source-side gate structure thus comprises a source-side gate dielectric layer 104 and a source-side gate electrode 106. The source-side gate electrode is determined by its work function, the source-side work function (WFsource). The source-side gate structure has a gate length (GL1).

The source-side gate structure and the reference gate structure are positioned adjacent of one another. The source-side gate structure is located at that side of the reference gate structure close to the source region 101, i.e., at the source-channel interface side. The presence of the source-side gate structure and the reference gate structure aside of one another enables that the tunneling region or event is shifted from the source-channel interface, where detrimental Urbach tails are present, to the interface or interface region 110 in between the source-side gate structure and the reference gate structure. As a consequence the overall properties of the TFET device 1 according to the present disclosure are enhanced: a steeper sub-threshold slope SS may be achieved and the TFET device 1 according to the present disclosure will not suffer from doping related non-idealities. In the figures an interface region 110 is schematically shown by the striped box, however one should keep in mind this interface region is schematically as tunneling paths are somewhat tilted towards the reference gate and the area of tunneling is dependent on the bias applied to the reference gate.

Figure 2:
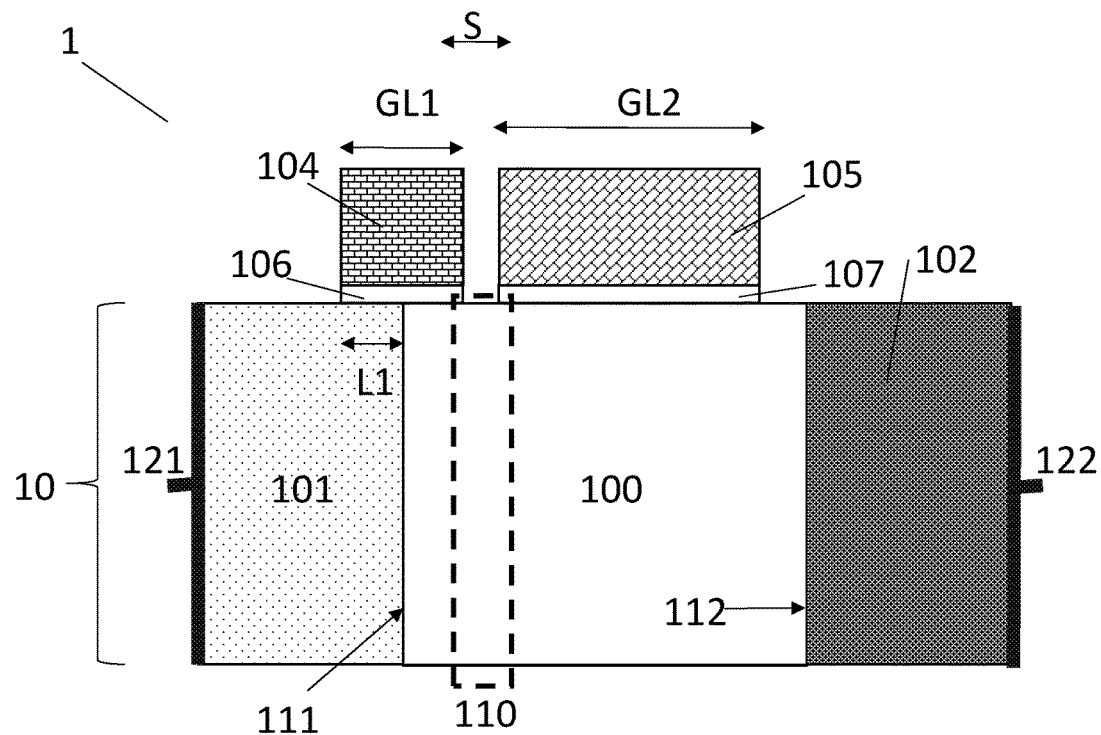
FIG. 2 illustrates schematic representations of a cross-section of a TFET structure according to an embodiment wherein the source-side gate structure and the reference gate structure are at a distance from each other.

According to embodiments the source-side gate structure and the reference gate structure may be in physical contact with each other (as in FIG. 1) or may be at a distance S of each other (i.e. there is a distance in between the source-side gate structure and the reference gate structure) (as in FIG. 2). Distance S is preferably smaller than or equal to 10 nm, more preferably smaller than 5 nm. The distance is chosen such that the subthreshold swing SS is improved without decreasing the on-current.

The distance S between the reference gate structure and the source-side gate structure may be occupied or filled with another material, such as a dielectric material or an airgap.

Figure 3:
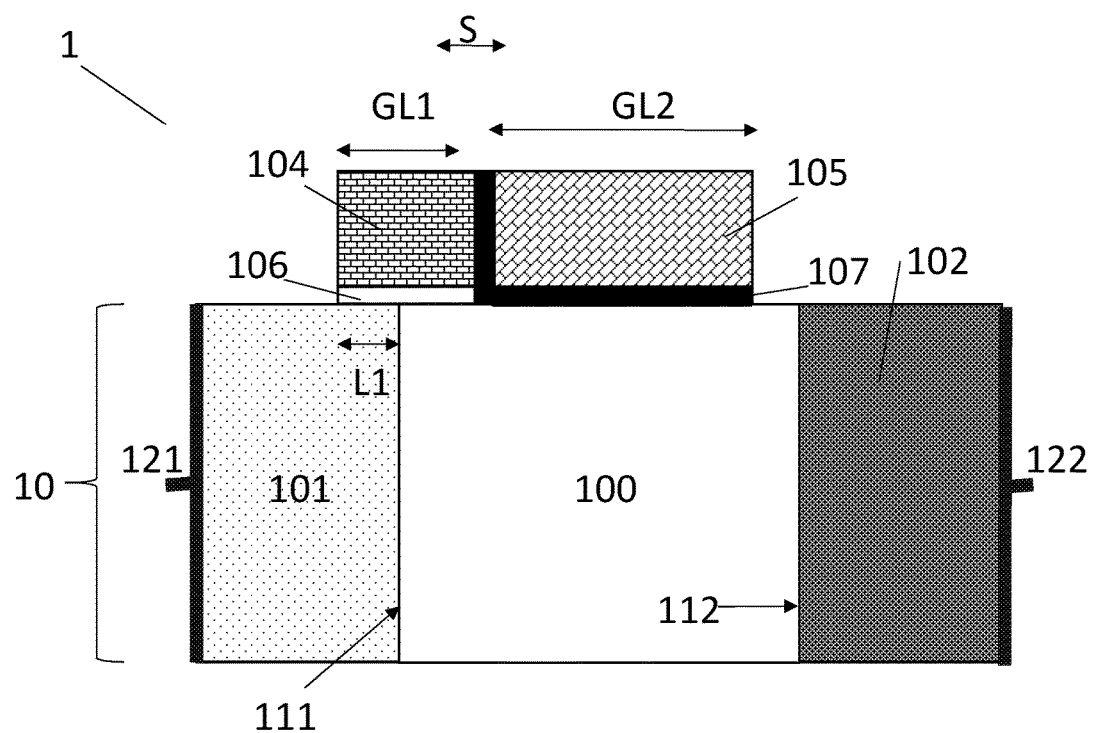
FIG. 3 illustrates schematic representations of a cross-section of a TFET structure according to an embodiment wherein a gate dielectric layer is present in between the reference gate structure and the source-side gate structure.

According to embodiments one or both of the reference gate dielectric layer or the source-side gate dielectric layer may be present in between the reference gate structure and the source-side gate structure as shown in FIG. 3. It is advantageous to deposit the different layers of the gate structures using conformal deposition techniques such as ALD. With conformal is meant with a uniform thickness and following the topography of the underlying substrate. By conformal deposition of the gate dielectric layers, they may be present in between the gate structures depending on the process flow for manufacturing the TFET.

Different embodiments are possible for the characteristics of the reference and/or source-side gate electrode and the reference and/or source-side gate dielectric.

According to embodiments, the reference gate structure and the source-side gate structure may have the same properties (for example same gate electrode material, same work function, same gate dielectric material). In this case the gate structure and the source-side gate structure should have a separate electrical gate contact. Thus a reference gate contact at the reference gate electrode and a source-side gate contact at the source-side gate electrode. By applying a different voltage to both gate contacts (and thus a different electrostatic potential is present at the respective gate electrodes), an accumulation or inversion layer is formed under the source-side gate structure thereby shifting the tunnel junction towards the interface or interface region in between the reference gate structure and the source-side gate structure. The accumulation or inversion layer resembles a charge sheet of carriers similar to the carriers in the source region 101, which means if the source region is p-type doped or n-type doped, the charged layer will comprise holes or electrons respectively. The reference gate structure and the source-side gate structure may share the same gate dielectric layer or may each have their own gate dielectric layer. The reference gate structure acts as the normal gate design as known for a prior art TFET structure. The voltage applied at the source-side gate contact should be such that it creates an accumulation (or inversion) layer under the source-side gate. The applied voltage to the source-side gate contact is dependent on the properties of the gate electrode and of the semiconducting material of the source-channel-drain structure. For example in case of a n-TFET structure, under normal operation, the device design should be such that the device is off at no (0V) gate voltage applied to the reference gate and is on at a supply voltage Vdd applied to the reference gate. In this example the voltage applied to the source-side gate structure therefore needs to be smaller than "Vdd minus the voltage bandgap offset ($E_g/q$) to be able to turn the TFET on, i.e., in the on state, at the interface or interface region in between the reference gate structure and the source-side gate structure. The electrostatic potential difference between the source-side gate structure and the reference gate structure electrodes should differ with the same Formula's as used below regarding the embodiments wherein the reference gate structure and the source-side gate structure may have different properties, i.e. different work functions. The difference in electrostatic potential $\psi$ should be at least $E_g$, or $E_g$+Vdd, in the on-state of the device.

$$|\psi_{source\text{-}electrode} - \psi_{ref\text{-}electrode}| > E_g \quad (1)$$

$$\text{For an nTFET: } \psi_{ref} > \psi_{source} + E_g \quad (2)$$

$$\text{For a pTFET: } \psi_{ref} < \psi_{source} - E_g \quad (3)$$

Or more preferred, because then tunneling becomes possible across and energy range of close to Vdd*q:

$$|\psi_{source} - \psi_{ref}| > E_g + \text{Vdd} \quad (4)$$

$$\text{For an nTFET: } \psi_{ref} > \psi_{source} + E_g + \text{Vdd} \quad (5)$$

$$\text{For a pTFET: } \psi_{ref} < \psi_{source} - E_g - \text{Vdd} \quad (6)$$

Whereby the induced band bending is such, that in the off-state, no BTBT is possible in the interface or interface region between the source-side gate structure and the reference gate structure.

According to alternative embodiments the reference gate structure and the source-side gate structure may have different properties (for example different gate electrode material, different work function, different gate dielectric material, different gate dielectric thickness). In this case a common electrical gate contact may be used for both gate structures. As the reference gate structure and the source-side gate structure may have the different properties, the reference work function (WFref) and the source-side work function (WFsource) will also be different in case a common electrical contact is used.

According to embodiments the reference work function (WFref) and the source-side work function (WFsource) should be selected such that the tunnel junction is shifted from the source-channel interface toward the interface or interface region into the channel region away from the source-channel interface. Otherwise said, the work functions are selected for allowing the tunneling mechanism of the TFET device in operation to occur at the interface or interface region between the source-side gate structure and the reference gate structure in the channel region. The difference between the reference work function (WFref) and the source-side work function (WFsource) is preferably larger than the bandgap energy $E_g$ of the semiconducting material of the channel region:

$$|WF_{source} - WF_{ref}| > E_g \quad (7)$$

$$\text{For an nTFET: } WF_{source} > WF_{ref} + E_g \quad (8)$$

$$\text{For a pTFET: } WF_{source} < WF_{ref} - E_g \quad (9)$$

Most preferred, the difference is larger than the bandgap energy $E_g$ of the semiconducting material of the channel region+the supply voltage Vdd (such that close to the full energy-window Vdd*q is used for BTBT current injection in the on-state):

$$|WF_{source} - WF_{ref}| > E_g + \text{Vdd} \quad (10)$$

$$\text{For an nTFET: } WF_{source} > WF_{ref} + E_g + \text{Vdd} \quad (11)$$

$$\text{For a pTFET: } WF_{source} < WF_{ref} - E_g - \text{Vdd} \quad (12)$$

For example for a semiconductor material comprising InGaAs, the difference in work function should be at least 0.7V.

According to embodiments wherein a heterostructure is used for the source-channel-drain structure, the difference between the work function of the source-side gate and the reference gate is preferably larger than the so called effective energy band gap. Due to the heterostructure there is no single $E_g$. Therefore the effective energy band gap should be taken into account which is from the valence band in one material of the heterostructure to the conduction band in the other material of the heterostructure. The effective energy band gap is typically smaller than the individual bandgaps.

The physical mechanism can be explained as follows. As the nTFET device is off, there is a charged layer underneath both gate structures (i.e. at the semiconductor/gate dielectric interface) with same carrier type as in the source region. As the nTFET device turns on, the charged carriers are pushed away underneath the semiconductor/reference gate dielectric interface, whereas the charged layer remains at the semiconductor/source-side gate dielectric interface. As a consequence band bending occurs inside the semiconductor material of the source-channel-drain structure. At a certain applied gate voltage the conduction band of the channel region is bent underneath the valence band of the source-side/channel interface and tunneling starts.

According to embodiments the source-side gate structure may partially cover the source region 101. There may be an overlap L1, which is defined as the length of the source region 101 which is covered by the source-side gate structure. The overlap L1 may be 0 nm (so there is no overlap, i.e. the source-side gate structure is not covering the source region 101) or larger than 0 nm. In case of an underlap, there would be an intrinsic region which the carriers (for example holes) have to find their way through to make it to the gated source region. This results in added resistance which is not desired. Therefore an overlap is advantageous. The overlap L1 is preferably smaller than 10 nm, more preferably smaller than 5 nm. It is an advantage of a smaller overlap that the parasitic capacitance to the source region is limited. The remaining part of the source-side gate structure (G1-L1) is then covering the channel region. This remaining part covers that part of the source-channel-drain structure which has less strong Urbach tails (as their magnitude decreases strongly with decreasing doping). The impact of Urbach tails in the source region 101 on the current through the device decreases exponentially with distance G1-L1 from the source and is therefore preferably larger than 5 nm, more preferably larger than 10 nm.

According to embodiments the reference gate structure may partially cover the drain region 102.

According to embodiments the reference gate structure may have an underlap L2 with the drain region 102. The underlap L2 is defined as the length of the channel region towards the drain region which is not covered by the reference gate structure. The underlap L2 is preferably smaller than 30 nm, more preferably smaller than 10 nm. It is an advantage of an underlap that it weakens or removes the ambipolar tunneling at the drain side thereby reducing the off-state leakage.

Figure 4:
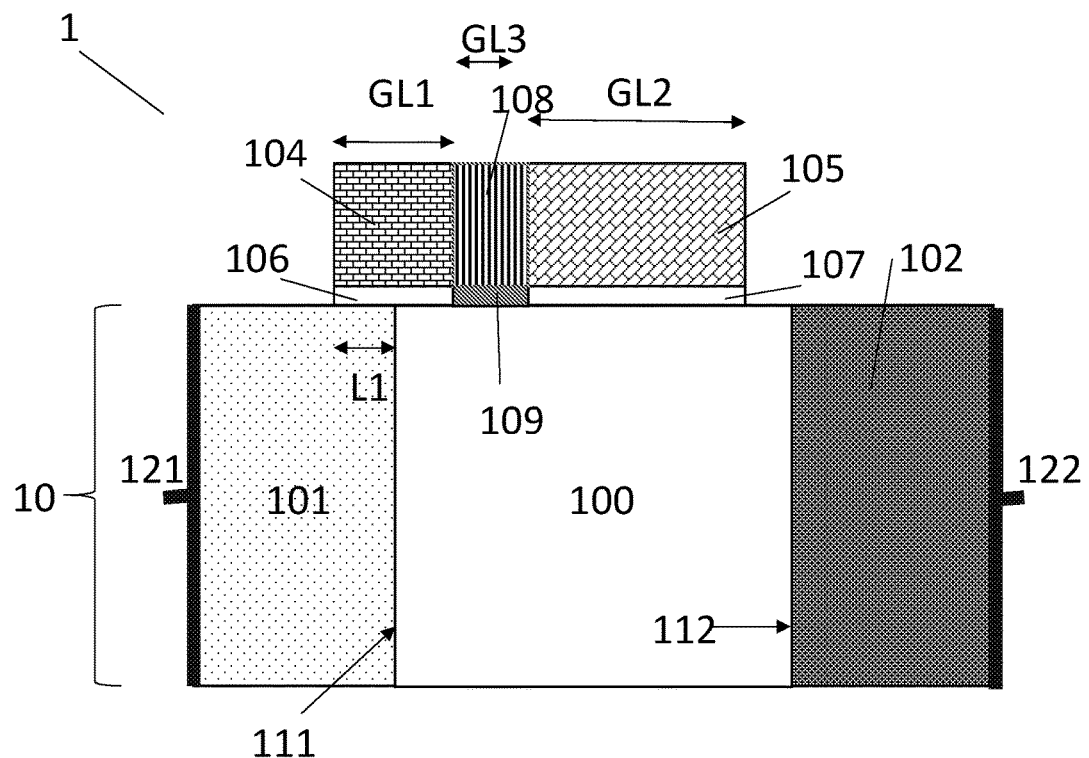
FIG. 4 illustrates schematic representations of a cross-section of a TFET structure according to an embodiment and comprising a pocket gate structure in between the source-side gate structure and the reference gate structure.

According to embodiments the TFET device 1 may further comprise a pocket gate structure in between the source-side gate structure and the reference gate structure (see FIG. 4). The pocket gate structure comprises a pocket gate dielectric layer 109 and a pocket gate electrode 108 having a pocket work function $WF_{pocket}$. The pocket gate structure may be in between and touching one or both of the source-side gate structure and the reference gate structure. The pocket gate structure may also be positioned at a distance of one or both of the source-side gate structure and the reference gate structure. For example one or both of the gate dielectric layers of the source-side gate structure or the reference gate structure may be present in between the pocket gate structure and the source-side gate structure and/or the reference gate structure.

The pocket work function $WF_{pocket}$ is selected to create a steep band bending at the source-gate/pocket-gate interface, whereby the conduction band (nTFET) underneath the pocket-gate is energetically pushed deeper down than the conduction band underneath the reference gate. It is an advantage of the pocket gate structure that the pocket enhances the subthreshold swing, because it prevents that turn-on occurs gradually with longer tunnel paths first, which are gradually decreasing: due to the pocket gate, the longer tunnel paths are only allowed to conduct after the short gate-source/gate-pocket tunnel paths have turned on, guaranteeing a steep onset.

For a nTFET the following relationship is preferred for the different work functions of the different gate structures:

$$WF_{ref} > WF_{pocket} \quad (4)$$

For a pTFET the following relationship is preferred for the different work functions of the different gate structures:

$$WF_{ref} < WF_{pocket} \quad (5)$$

The gate electrodes 104, 105, 108 are situated on the respective gate dielectric layers 106, 107, 109 so as to not extend beyond the gate dielectric layer.

Figure 5:
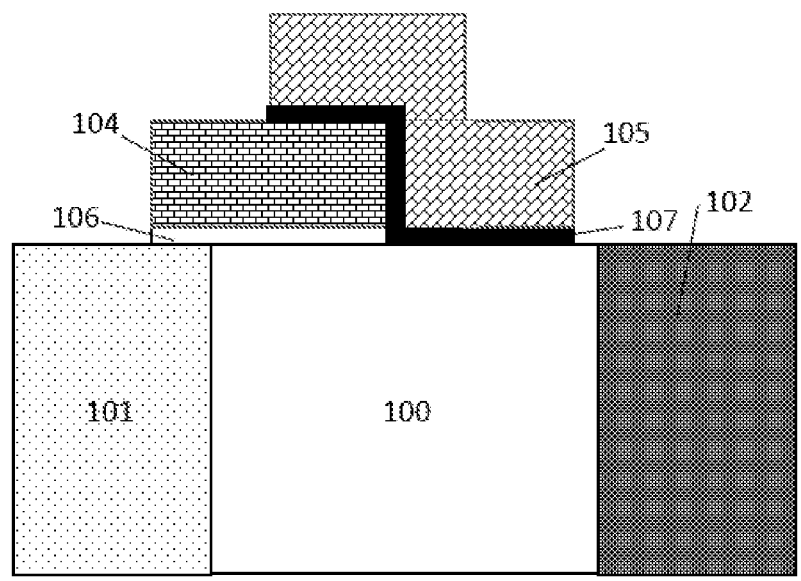
FIG. 5 illustrates schematic representations of a cross-section of a TFET structure according to an embodiment wherein a particular gate structure positioning is shown.
Figure 6:
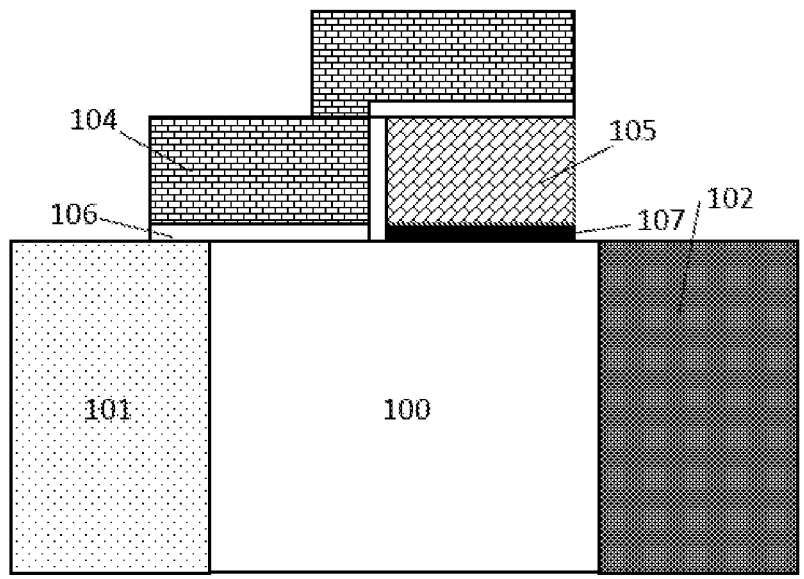
FIG. 6 illustrates schematic representations of a cross-section of a TFET structure according to an embodiment wherein a particular gate structure positioning is shown.

The gate dielectric layers 106, 107, 109 of the different gate structures may be positioned in different manners according to different embodiments as shown in FIGS. 5 and 6. At least one of the gate dielectric layers may be formed in a conformal manner over one of the gate structures and the source-channel-drain structure. Part of the gate dielectric layer will thus be present in between one of the gate electrodes and the source-channel-drain structure but also on top of the gate electrode of one of the other gate structures.

The gate dielectric layers 106, 107, 109 are preferably aligned with their respective gate electrodes 104, 105, 108. The gate dielectric layers 106, 107, 109 are preferably at least situated below the whole length of their respective gate electrodes 104, 105, 108 but can cover up to the whole length of the TFET source-channel-drain structure.

While some embodiments described herein include examples of a planar TFET device, also other implementations of TFET devices may be applied in embodiments of the present disclosure, such as double-gate TFET, a tri-gate TFET, an all-round gate TFET, a nanowire TFET, . . . . A double-gate TFET comprises a source-channel-drain structure in the plane of a semiconductor substrate, e.g. a horizontal source-channel-drain structure, and a double gate electrode situated on the sidewalls of the source region of the horizontal source-channel-drain structure. A tri-gate TFET comprises a source-channel-drain structure in the plane of a semiconductor substrate, e.g. a horizontal source-channel-drain structure, and a triple gate electrode comprising three gate electrode parts situated respectively on the sidewalls and on top of the source region of the horizontal source-channel-drain structure. A gate all-around TFET comprises a horizontal or a vertical source-channel-drain structure, i.e. a source-channel-drain structure in the plane of a substrate or substantially perpendicular to the plane of the substrate, and an all-around gate electrode situated around, i.e. surrounding or encircling, the source region of the horizontal or vertical source-channel-drain structure. A nanowire TFET comprises a nanowire which forms at least the channel region, and optionally the channel region and one or more of the source and drain regions, and an all-around gate electrode structure around, i.e. surrounding or encircling, the source region of the nanowire TFET.

The concept of the TFET of embodiments and other characteristics, features and advantages are furthermore applicable to all TFET implementations, independent of the semiconductor material used as source material, as channel material, and as drain material, including TFETs with a source material which is different from the channel material and/or which is different from the drain material, including TFETs with a drain material which is different from the channel material. Possible semiconducting materials are including but not limited to group IV materials such as Si, Ge, C or binary compounds thereof, or group MN materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes or 2D materials (graphene, transition metal dichalcogenides)

The concept of the TFET of embodiments and other characteristics, features and advantages are furthermore applicable to all TFET implementations, independent of the gate dielectric material and thickness. Possible gate dielectric materials are including but not limited to silicon based oxides (e.g., silicon dioxide, silicon oxy nitride), aluminum oxide, high-k oxides (oxides, nitrided oxides, silicates and nitrided silicates of transition metals such as Hf, Ta, Ti, Nb, V, Y, Zr).

What is claimed is:

1. A tunnel field-effect transistor, comprising:
   a source-channel-drain structure of a semiconducting material comprising:
      a source region doped with a dopant element having a source type of doping of N or P,
      a drain region doped with a dopant element having a drain type of doping opposite to the source type of doping, and
      a channel region situated between the source region and the drain region and forming a source-channel interface with the source region and a drain-channel interface with the drain region, wherein the channel region is intrinsic or lowly doped;
   a reference gate structure comprising a reference gate dielectric layer and a reference gate electrode having a reference work function and a reference electrostatic potential, wherein the reference electrostatic potential is an electrostatic potential present at the reference gate electrode, wherein the reference gate dielectric layer is sandwiched in between a semiconducting material of the channel region and the reference gate electrode; and
   a source-side gate structure aside of the reference gate structure, the source-side gate structure comprising a source-side gate dielectric layer and a source-side gate electrode having a work function and an source-side electrostatic potential, wherein the source-side electrostatic potential is an electrostatic potential present at the source-side gate electrode, wherein the source-side gate dielectric layer is sandwiched between the semiconducting material of the channel region and the source-side gate electrode, wherein the work function or the electrostatic potential of the source-side gate structure and the reference gate structure are selected to allow a tunneling mechanism of the tunnel field-effect transistor, in operation, to occur at an interface or an interface region in the channel region between the source-side gate structure and the reference gate structure.

2. The tunnel field-effect transistor of claim 1, wherein a difference between the work function and the reference work function is at least a band gap of the semiconductor material.

3. The tunnel field-effect transistor of claim 1, wherein the work function is larger than the reference work function for a P-type source region and the work function is smaller than the reference work function for an N-type source region.

4. The tunnel field-effect transistor of claim 1, wherein a difference between the electrostatic potential and the reference electrostatic potential is at least a band gap of the semiconductor material.

5. The tunnel field-effect transistor of claim 1, wherein the source-side gate structure and the reference gate structure are positioned at a distance from each other.

6. The tunnel field-effect transistor of claim 5, wherein the distance is smaller than 10 nm.

7. The tunnel field-effect transistor of claim 1, wherein the source-side gate structure has an overlap with the source region.

8. The tunnel field-effect transistor of claim 1, wherein the reference gate structure has an overlap or an underlap with the drain region.

9. The tunnel field-effect transistor of claim 8, wherein the overlap or the underlap is from 0 nm to 10 nm.

10. The tunnel field-effect transistor of claim 1, further comprising a pocket gate structure, the pocket gate structure comprising a pocket gate dielectric layer and a pocket gate electrode having a pocket work function, the pocket gate structure located on the channel region in between the source-side gate structure and the reference gate structure.

11. The tunnel field-effect transistor of claim 10, wherein the pocket work function is smaller than the reference work function for a P-type source region and the pocket work function is larger than the reference work function for an N-type source region.

12. The tunnel field-effect transistor of claim 1, wherein a doping level of the channel region is from undoped to $10^{18}/cm^3$.

13. The tunnel field-effect transistor of claim 1, wherein a doping level of the source region is from $10^{19}/cm^3$ to $4e10^{20}/cm^3$.

14. The tunnel field-effect transistor of claim 1, wherein a doping level of the drain region is from $10^{18}/cm^3$ to $4e10^{20}/cm^3$.

15. The tunnel field-effect transistor of claim 1, wherein the source-channel-drain structure is a horizontal structure and the gate electrodes are each single gate structures.

16. The tunnel field-effect transistor of claim 1, wherein the source-channel-drain structure is a horizontal structure and the gate electrodes are each double gate structures situated at both sidewalls of the horizontal source-channel-drain structure opposite to each other.

* * * * *